United States Patent [19]
Yamamori

[11] Patent Number: 5,679,499
[45] Date of Patent: Oct. 21, 1997

[54] METHOD FOR FORMING PHOTO MASK FOR USE IN FABRICATING SEMICONDUCTOR DEVICE

[75] Inventor: Atsushi Yamamori, Tokyo, Japan

[73] Assignee: NEC Corporation, Tokyo, Japan

[21] Appl. No.: 596,747

[22] Filed: Feb. 5, 1996

[30] Foreign Application Priority Data

Feb. 21, 1995 [JP] Japan ................................ 7-032162

[51] Int. Cl.$^6$ ........................................ G03F 7/00
[52] U.S. Cl. ........................................ 430/313; 430/311
[58] Field of Search ........................ 430/311, 313, 430/318, 323

[56] References Cited

U.S. PATENT DOCUMENTS

| | | | |
|---|---|---|---|
| 5,332,625 | 7/1994 | Dunn | 428/409 |
| 5,401,613 | 3/1995 | Brewer | 430/323 |
| 5,431,774 | 7/1995 | Douglas | 216/57 |

FOREIGN PATENT DOCUMENTS

| | | |
|---|---|---|
| 61-91922 | 5/1986 | Japan . |
| 61-128524 | 6/1986 | Japan . |

*Primary Examiner*—Kathleen Duda
*Attorney, Agent, or Firm*—Whitham, Curtis, Whitham & McGinn

[57] ABSTRACT

A method for fabricating a semiconductor device includes the steps of exposing and developing a resist film applied on a conductive film formed over a semiconductor substrate, and removing a resist residue developed on the resist film. The removal of a resist residue is made by irradiating thereon the helium plasma generated using a helium gas in a parallel plate type plasma etching system. Thereafter, the conductive film is dry-etched and patterned using the resist film as a mask. The use of the helium gas plasma etching process enables the delaying of the etching rate and the suppression of the thinning of the resist film thereby enhancing the size precision of the photo mask.

7 Claims, 3 Drawing Sheets

METHOD FOR FORMING PHOTO MASK FOR USE IN FABRICATING SEMICONDUCTOR DEVICE

BACKGROUND OF THE INVENTION (1) Field of the Invention

The present invention relates to a method for fabricating a semiconductor device, and more particularly to a method of forming a photo mask.

(2) Description of the Related Art

During the patterning of a resist film for forming a photo mask for use in fabricating a semiconductor device, there develops a resist residue called scum in a patterned resist film caused by, for example, the exposure non-uniformity or the swelling of the resist film resulting from an affect of an organic solvent used for the development, and this deteriorates the pattern shapes. Thus, it is necessary to carry out the process by which the resist residue is removed in order to enhance the pattern precision of the resist film.

A conventional method for removing the resist residue is disclosed in Japanese Patent Application Kokai Publication No. Sho 61-128524 or Japanese Patent Application Kokai Publication No. Sho 61-91922, in which an argon (Ar) gas is employed for an argon plasma process.

An example of a conventional semiconductor device fabrication method is explained with reference to FIGS. 1A, 1B and 1C which are sectional views of the device for showing sequential steps of the method.

First, as shown in FIG. 1A, after a polysilicon film 3 is deposited on an insulating film 2 formed on a semiconductor substrate 1, a photoresist film 4 is deposited and exposed, and the exposed portion of the photoresist film 4 is removed by using a developing solution. Here, the space between the patterns of the patterned photoresist film 4 is extremely narrow so that the exposure at this portion becomes insufficient and the resist residue 5 develops and remains after the exposure. Thus, it is necessary to remove this resist residue 5 by an etching process.

As shown in FIG. 1B, the resist residue 5 is removed by plasma etching with an argon gas by using a plasma etching system. Here, simultaneously with the removal of the resist residue 5, a surface of the photoresist film 4 is inevitably etched and, as a result, the photoresist film 4a results in a slim pattern reduced from the dimension of the original pattern.

Then, as shown in FIG. 1C, the polysilicon film 3 is dry-etched using the photoresist film 4a as a mask. Consequently, the polysilicon film 3 ends up in a pattern which is narrower than the desired mask dimension.

In the above conventional semiconductor fabrication method, the resist residue is removed by a plasma etching process using argon gas but, since this process is a process in which the rate of etching the resist film is fast, the resist film suffers from a reduction of the film thickness. The problem presented is that it is difficult to control the dimension of the element to be patterned using such a resist film as a mask.

SUMMARY OF THE INVENTION

An object of the present invention, therefore, is to overcome the problems existing in the prior art, and to provide a method for fabricating a semiconductor device with which the dimension reduction of the resist film during the resist residue removal is prevented whereby the element size precision is enhanced in the semiconductor device fabrication.

According to one aspect of the invention, there is provided a method for fabricating a semiconductor device, comprising the steps of:

exposing and developing a resist film applied on a conductive film formed over a semiconductor substrate;

removing a resist residue developed on the resist film by irradiating helium plasma on the resist residue, the helium plasma being generated using a helium gas in a parallel plate type plasma etching system; and dry-etching and patterning the conductive film using the resist film as a mask.

According to the method of the present invention, the use of the helium gas plasma etching process for removing the resist residue enables the delaying of the resist film etching rate and the suppression of the thinning of the resist film thereby enhancing the size precision of the photo mask.

Also, it is possible to ensure the uniformity of the etching rate within the wafer plane, with the variations in the element size precision within the wafer plane improved from 0.07 μm in the prior art to 0.01 μm according to the invention. This contributes to the enhancement of the performance reliability of the semiconductor device.

BRIEF DESCRIPTION OF THE DRAWINGS

The above and other objects, features and advantages of the present invention will be apparent from the following description of a preferred embodiment of the invention explained with reference to the accompanying drawings, in which.

DETAILED DESCRIPTION OF THE PREFERRED EMBODIMENT OF THE INVENTION

Now, a preferred embodiment of the invention is explained with reference to the drawings.

Figure 1A:
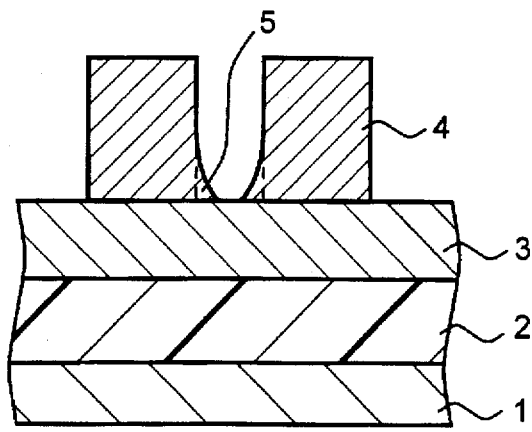
FIGS. 1A–1C are sectional views of a semiconductor device for showing sequential steps of a conventional method for fabricating the same.
Figure 1B:
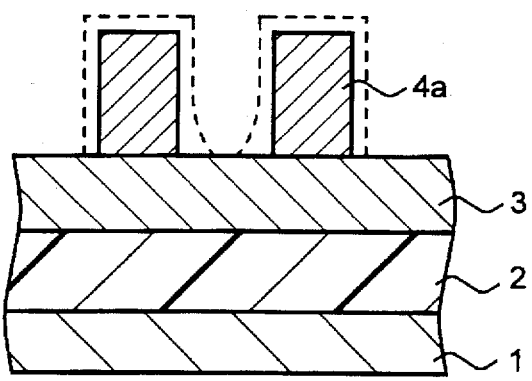
Figure 1C:
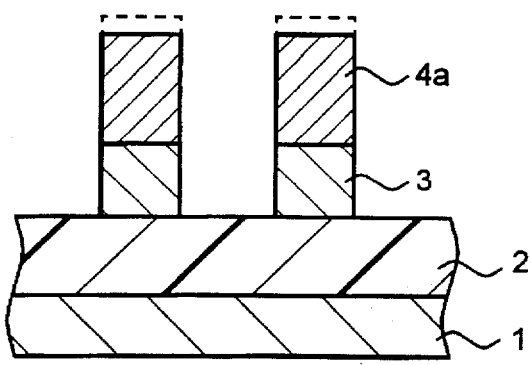
Figure 2A:
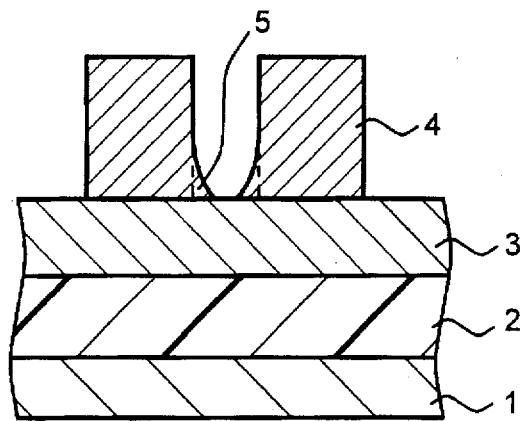
FIGS. 2A–2C are sectional views of a semiconductor device for showing sequential steps of a method for fabricating the same according to the present invention.
Figure 2B:
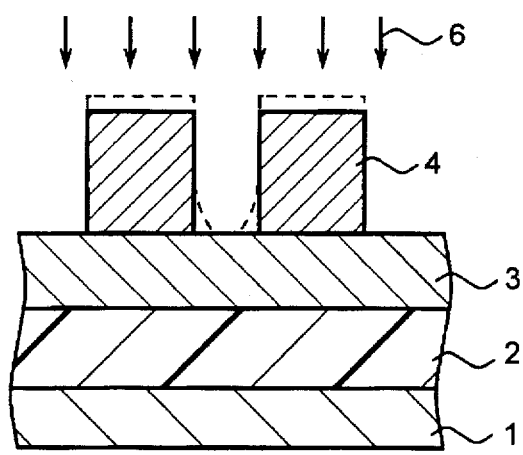
Figure 2C:
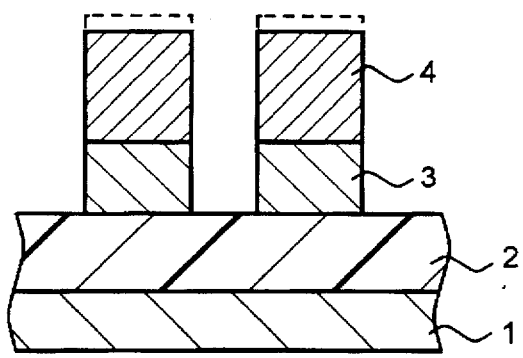

FIGS. 2A–2C show, in sectional views, a structure under fabrication for use in explaining sequential process steps of the method according to the invention.

First, as shown in FIG. 2A, a polysilicon film 3 is deposited on an insulating film 2 formed on a semiconductor substrate 1, a photoresist film 4 is coated on the polysilicon film 3, and a predetermined pattern is exposed and developed, whereby a photo mask is formed. At this time, there develops a resist residue (scum) 5 at a bottom portion of the patterned photoresist film 4.

Then, as shown in FIG. 2B, a helium (He) gas is introduced at a flow rate of 50–300 SCCM into a parallel plate type plasma processing system, a helium plasma 6 which is generated under a pressure of 50–300 mTorr and a power density of 1.5–3.0 W/cm$^2$ with respect to a parallel plate electrode is irradiated on the photoresist film 4 so as to remove the resist residue 5, thus defining the pattern of the photoresist film 4.

Next, as shown in FIG. 2C, the polysilicon film 3 is patterned by the ion etching process with a helium gas which is carried out in the same chamber and in which the photoresist film 4 is used as a mask.

In the embodiment according to the invention, the plasma process for removing the resist residue 5 employs the helium gas (atomic weight: 4.0) whose atomic weight is smaller by one order of magnitude than that of the argon gas (atomic weight: 39.9) conventionally used. Thus, the ion energy is low and it is possible to suppress the etching rate of the resist film 4 to a low rate, thereby eliminating the problem of the entire resist film 4 becoming thin as in the prior art.

Figure 3:
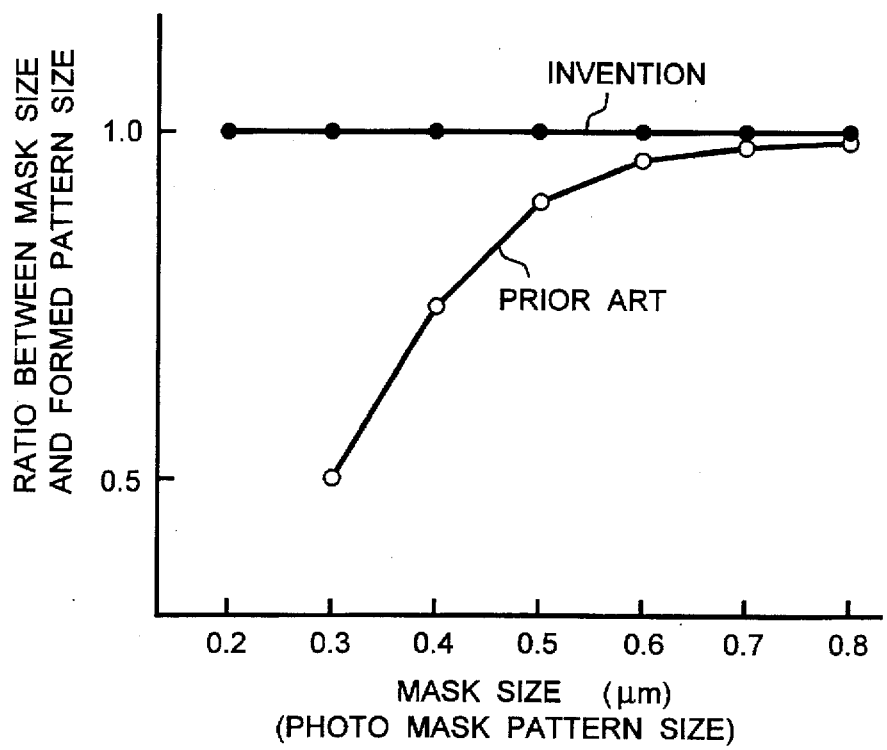
FIG. 3 is a graph showing the ratio between the pattern size of a photo mask and the pattern size of the element formed using the photo mask for the invention and the prior art.

FIG. 3 shows the ratio between the pattern size (called "mask size") of a photo mask and the pattern size of the element formed using the photo mask (device size/mask size ratio) according to the invention and that according to the prior art.

As shown in FIG. 3, according to the invention, the reduction or thinning of the photoresist film during the resist residue removal process can be eliminated thereby preventing the deviation of the element pattern size from the mask size (design size) resulting in, for example, defective wiring interconnection as occurred in the prior art.

Figure 4:
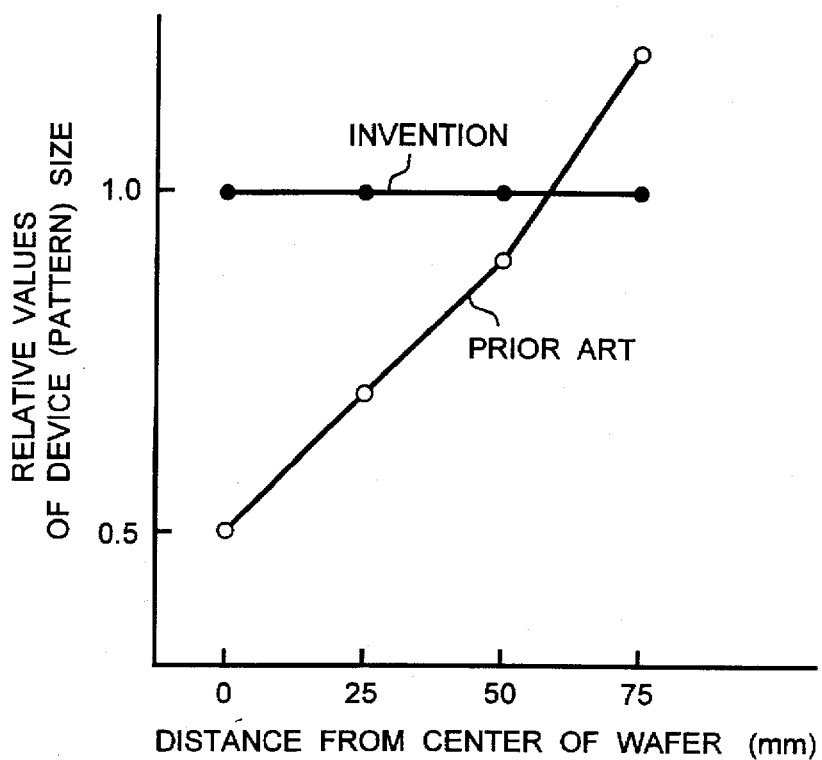
FIG. 4 is a graph showing the pattern sizes within a wafer plane for the invention and for the prior art.

FIG. 4 shows pattern sizes within a wafer plane. It is noted therefrom that the embodiment according to the invention overcomes the problem of pattern size variations.

While the invention has been described in its preferred embodiment, it is to be understood that the words which have been used are words of description rather than limitation and that changes within the purview of the appended claims may be made without departing from the true scope of the invention as defined by the claims.

What is claimed is:

1. A method of fabricating a semiconductor device, comprising steps of:

exposing and developing a resist film applied on a conductive film formed over a semiconductor substrate to form a resist pattern;

removing a resist residue developed on said resist pattern by irradiating helium plasma on said resist residue, with no change occurring in the dimension of said pattern said helium plasma being generated using a helium gas in a parallel plate plasma etching system; and dry-etching and patterning said conductive film using said resist pattern as a mask.

2. The method for fabricating a semiconductor device according to claim 1, in which said helium gas is introduced into said parallel plate plasma etching system at a flow rate of 50–300 SCCM, said helium plasma being generated under a pressure of 50–300 mTorr and a power density of 1.5–3.0 W/cm$^2$ with respect to a parallel plate electrode.

3. The method according to claim 2, wherein said conductive film includes a polysilicon film.

4. The method according to claim 2, wherein said step of removing and said step of dry-etching and patterning are conducted in the same chamber.

5. The method according to claim 1, wherein said conductive film includes a polysilicon film.

6. The method according to claim 5, wherein said step of removing and said step of dry-etching and patterning are conducted in the same chamber.

7. The method according to claim 1, wherein said step of removing and said step of dry-etching and patterning are conducted in the same chamber.

* * * * *